(12) United States Patent
Pratt et al.

(10) Patent No.: US 8,976,849 B2
(45) Date of Patent: Mar. 10, 2015

(54) CALIBRATION SIGNAL GENERATOR

(75) Inventors: Patrick Pratt, Mallow (IE); Hari Thirumoorthy, Chandler, AZ (US); Conor O'Keeffe, Cork (IE)

(73) Assignee: Freescale Semiconductor, Inc., Austin, TX (US)

( * ) Notice: Subject to any disclaimer, the term of this patent is extended or adjusted under 35 U.S.C. 154(b) by 1189 days.

(21) Appl. No.: 12/523,934

(22) PCT Filed: Jan. 22, 2007

(86) PCT No.: PCT/EP2007/050606
§ 371 (c)(1),
(2), (4) Date: Mar. 9, 2011

(87) PCT Pub. No.: WO2008/089841
PCT Pub. Date: Jul. 31, 2008

(65) Prior Publication Data
US 2011/0182335 A1    Jul. 28, 2011

(51) Int. Cl.
*H04L 27/14*  (2006.01)
*H03D 3/00*   (2006.01)
*H04L 27/00*  (2006.01)

(52) U.S. Cl.
CPC .......... *H03D 3/009* (2013.01); *H04L 27/0014* (2013.01); *H04L 2027/0016* (2013.01)
USPC ..................................................... 375/224

(58) Field of Classification Search
USPC .................... 375/224, 219, 316, 261, 346
See application file for complete search history.

(56) References Cited

U.S. PATENT DOCUMENTS

| 4,914,380 | A | * | 4/1990 | Dadds | 324/76.45 |
| 5,826,180 | A |   | 10/1998 | Golan | |
| 6,134,227 | A | * | 10/2000 | Magana | 370/330 |
| 6,842,489 | B2 | * | 1/2005 | Masenten | 375/261 |
| 6,931,343 | B2 |   | 8/2005 | Webster et al. | |
| 7,088,765 | B1 |   | 8/2006 | Green et al. | |
| 7,675,336 | B1 | * | 3/2010 | Foo et al. | 327/175 |
| 7,859,309 | B2 | * | 12/2010 | Lo | 326/93 |
| 2004/0203472 | A1 | * | 10/2004 | Chien | 455/68 |
| 2005/0008107 | A1 |   | 1/2005 | Brown | |
| 2005/0069056 | A1 | * | 3/2005 | Willingham | 375/327 |
| 2005/0075815 | A1 |   | 4/2005 | Webster et al. | |
| 2005/0105648 | A1 | * | 5/2005 | Masenten | 375/316 |
| 2005/0276350 | A1 | * | 12/2005 | Li | 375/302 |
| 2006/0068739 | A1 |   | 3/2006 | Maeda et al. | |
| 2006/0133548 | A1 | * | 6/2006 | Oh et al. | 375/346 |
| 2007/0058702 | A1 | * | 3/2007 | Zhang | 375/219 |
| 2007/0099570 | A1 | * | 5/2007 | Gao et al. | 455/63.1 |
| 2007/0291883 | A1 | * | 12/2007 | Welz et al. | 375/350 |
| 2008/0045162 | A1 | * | 2/2008 | Rofougaran et al. | 455/73 |
| 2008/0136498 | A1 | * | 6/2008 | Roufougaran et al. | 327/534 |
| 2008/0233873 | A1 | * | 9/2008 | Rofougaran et al. | 455/41.2 |

FOREIGN PATENT DOCUMENTS

| EP | 1619805 A | 1/2006 |
| GB | 2406984 A | 4/2005 |

* cited by examiner

*Primary Examiner* — Jaison Joseph (57) ABSTRACT

A calibration signal generator for use in a balancing circuit calibration device in a radio receiver, the calibration signal generator comprising: a means of amplifying a clocking signal from a clocking signal generator to provide a first calibration signal; a means of generating a second calibration signal from the clocking signal, the first and second calibration signals being transmissible to a one or more mixing circuits in the balancing circuit calibration device; and a means synchronizing the operation of other circuit elements in the balancing circuit calibration device with the clocking signal; characterized in that the clocking signal generator is present in the radio receiver and used therein for other functions.

19 Claims, 9 Drawing Sheets

CALIBRATION SIGNAL GENERATOR

FIELD OF THE INVENTION

The present invention relates to a calibration signal generator, and in particular, a calibration signal generator for use in a balancing circuit calibration device for a radio receiver.

BACKGROUND OF THE INVENTION

The growing market for portable wireless communication systems (e.g. wireless phones, wireless local area networks [WLANs], and global positioning systems [GPS]) has increased the need for low-cost and high-performance receivers. Thus, in view of their relatively simple implementation and low cost, very low intermediate frequency (VLIF) circuits are being increasingly used in wireless receivers (instead of other architectures such as superheterodyne and direct conversion).

VLIF receivers require stringent balancing of their IQ paths to maintain acceptable image rejection. Even with careful analogue design, dedicated systems are required for such balancing. However, these systems require calibration to counter the effects of process, temperature, supply and frequency variation.

Calibration can be accomplished online (i.e. whilst receiving an incoming signal) or offline (i.e. using a dedicated training signal). However, recent studies have shown that adaptive algorithms used in online calibration, do not converge rapidly enough to meet the demands of an enhanced GPRS (EGPRS) standard. Similarly, providing dedicated hardware for offline calibration is proving very costly. In general prior art systems for calibrating balancing circuits require three different frequency sources, namely

- a real-valued radio-frequency (RF)-tone tunable to any frequency ($f_{RX}$) in a designated mobile phone frequency band (and thereby generate a test tone for the balancing circuits);
- a complex-valued RF-local-oscillator (LO) tunable to a small-frequency-offset ($f_O$) (approximately 100 KHz) from the real-valued RF-tone; $f_{RX}$ and
- a digital-local-oscillator (DLO) capable of generating a complex-valued digital intermediate frequency (IF) tone (of frequency $f_O$) and a sampling-frequency ($f_S$) matching that of analogue to digital converters (ADCs) in the balancing circuits.

In particular, US patent Application US20050008107 describes a receiver which comprises a mechanism for correcting frequency dependent I/Q phase error, wherein the receiver employs a dedicated RF tone generator to drive its mixer circuits. U.S. Pat. No. 6,931,343 describes an on-signal calibration system which uses the I and Q signals of a transmitter to remove distortions in an RF output signal. Similarly, UK Patent GB2406984 describes a method and arrangement for self-tuning I-Q balancing for an I-Q radio receiver.

SUMMARY OF THE INVENTION

According to the invention there is provided a calibration signal generator as provided in the appended Claims.

BRIEF DESCRIPTION OF THE DRAWINGS

Two embodiments of the invention will hereby be described, by way of example only, with reference to the accompanying figures in which:

FIG. 4b is a complex number representation of the signal resulting from the demodulation process of FIG. 4a;

FIGS. 9-11 show harmonics and duty cycle parameters for generating calibration test tones in the GSM 850, GSM 900, DCS 1800 and PCS 1900 frequency bands using clocking signals of 6.5 MHz, 13 MHz, 26 MHz and 52 MHz signals from a crystal in accordance with the first embodiment.

DETAILED DESCRIPTION OF THE PREFERRED EMBODIMENTS

The following discussion will first describe the origins and nature of I/Q imbalance during the normal operation of a demodulator in a radio receiver. The discussion will then turn to a broad overview of the calibration signal generator of the present embodiments with reference to its use in a balancing circuit calibration device. This will be followed by a more detailed examination of the clocking signal generating systems and clocking signal processing systems employed in the first and second embodiments. After this, the coherency conditions of the calibration signal generator will be examined. The description will finish with a discussion of two potential implementations of the calibration signal generator.

A. I/Q Imbalance

A radio frequency (RF) communication system typically comprises a transmitter and a receiver. In use, the transmitter transmits an information-bearing signal x(t) (sometimes known as a baseband signal) to the receiver. To more efficiently transmit the baseband signal x(t), the transmitter may modulate the signal onto a carrier signal of frequency $\omega_c$ (wherein $\omega_c$ is known as the carrier frequency). This causes the baseband signal x(t) to be shifted to the carrier frequency $\omega_c$. The resulting signal s(t) can be described by $$s(t)=A(t)\sin(\omega_c t+\phi(t)+\phi_0) \quad (1)$$

wherein A(t), φ(t) and φ₀ denote the amplitude, phase and phase offset of the signal. The modulated signal s(t) may be altered (e.g. by noise) on transmission through a channel (or medium), to form the signal (received by the receiver) ŝ(t).

Figure 1:
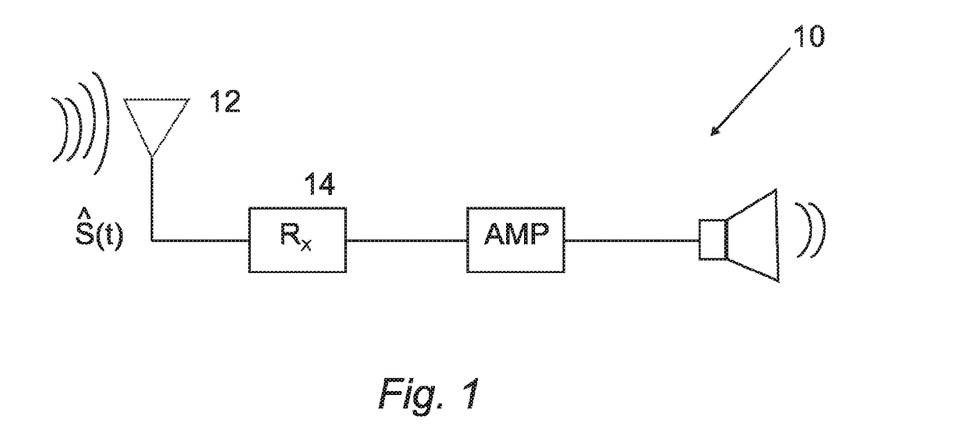
FIG. 1 is a block diagram of a conventional wireless receiver.
Figure 2:
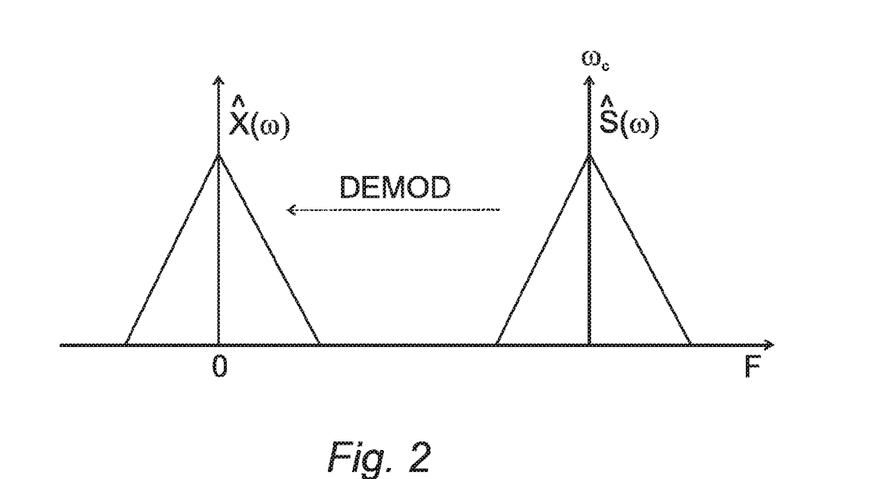
FIG. 2 is a frequency spectrum of an incoming modulated signal ŝ(t) which is demodulated to a baseband signal x̂(t)

Referring to FIG. 1, a receiver 10 comprises an antenna 12 linked to receiver circuitry 14. In use, the antenna 12 receives the modulated signal ŝ(t). Referring to FIG. 2, the receiver circuitry then converts the received signal ŝ(t) into a baseband signal x̂(t) (by multiplying the received signal ŝ(t) with a local reference signal at the carrier frequency $\omega_c$) and recovers modulating information (A(t) and φ(t)) therefrom.

Figure 3:
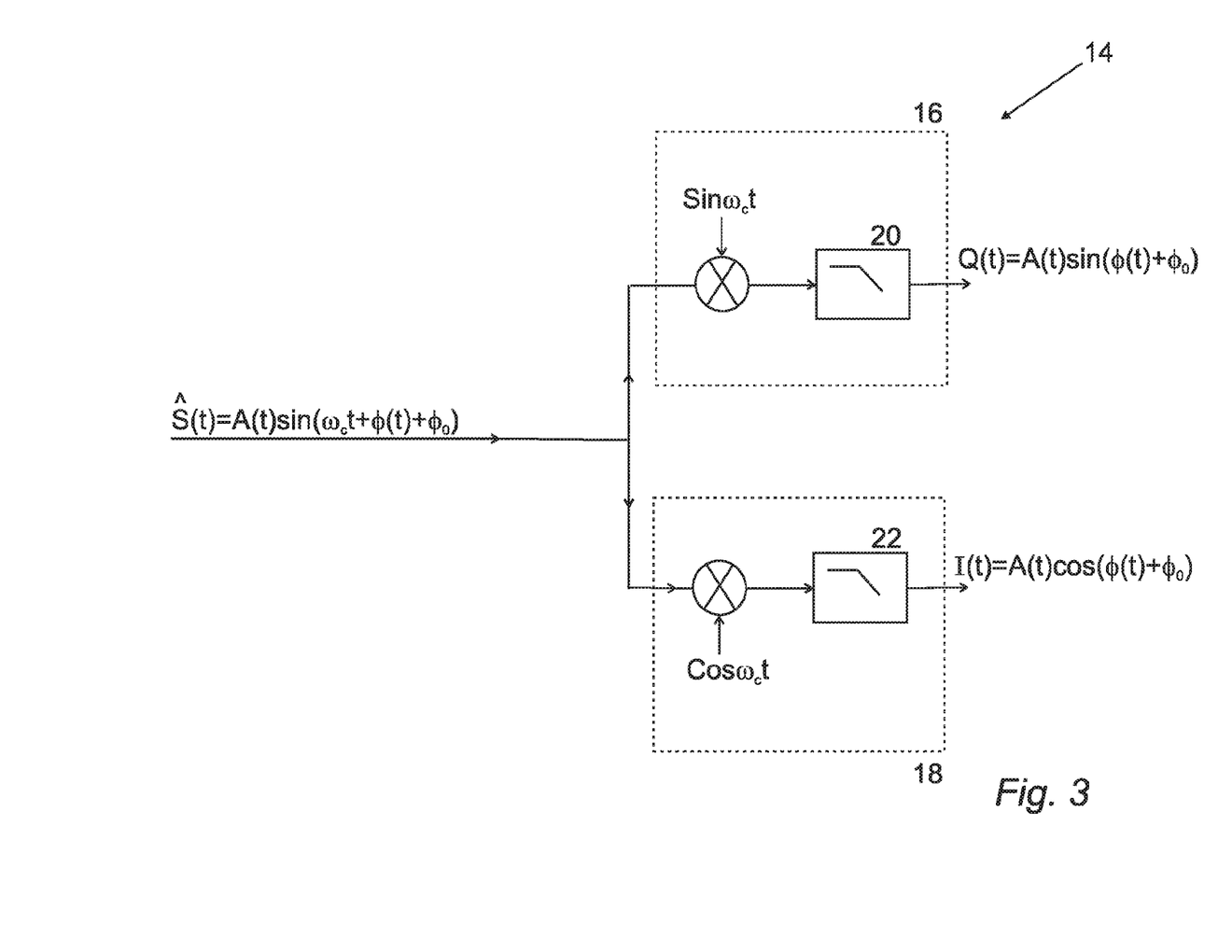
FIG. 3 is a block diagram of a demodulation system in the conventional wireless receiver of FIG. 1.

More specifically, referring to FIG. 3, the receiver circuitry 14 converts the received signal ŝ(t) into a complex baseband signal by quadrature demodulation with quadrature and in-phase mixers 16, 18. The quadrature mixer 16 multiplies the received signal ŝ(t) with a sine wave at the carrier frequency $\omega_c$ and low pass filters 20 the resulting signal to yield a quadrature signal Q(t), which can be described by the expression:

$$Q(t)=A(t)\sin(\phi(t)+\phi_0) \quad (2)$$

Similarly, the in-phase mixer 18 multiplies the received signal ŝ(t) with a cosine wave at the carrier frequency $\omega_c$ and low pass filters 22 the resulting signal to yield an in-phase signal I(t), which can be described by the expression $$I(t)=A(t)\cos(\phi(t)+\phi_0) \quad (3)$$

Thus, in effect, a quadrature demodulator splits a received signal ŝ(t) into in-phase (I(t)) and quadrature (Q(t)) components that are processed separately in respective I and Q channels.

Figure 4A:
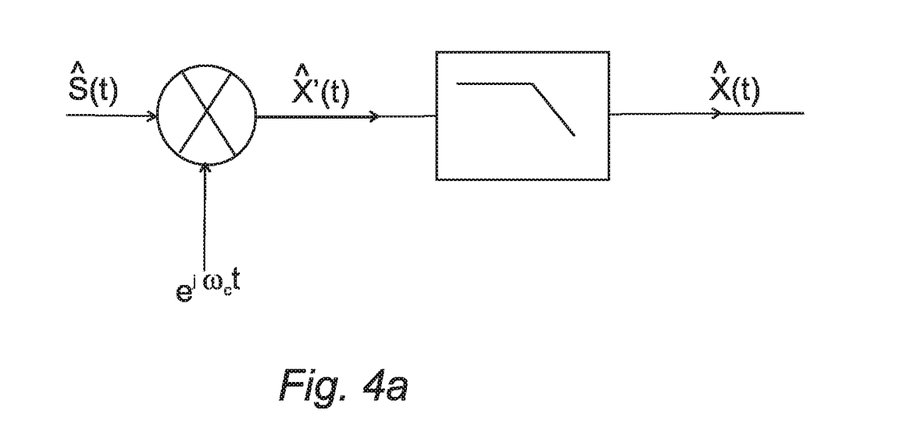
FIG. 4a is a frequency domain representation of the demodulation process provided by the demodulation system of FIG. 3.
Figure 4B:
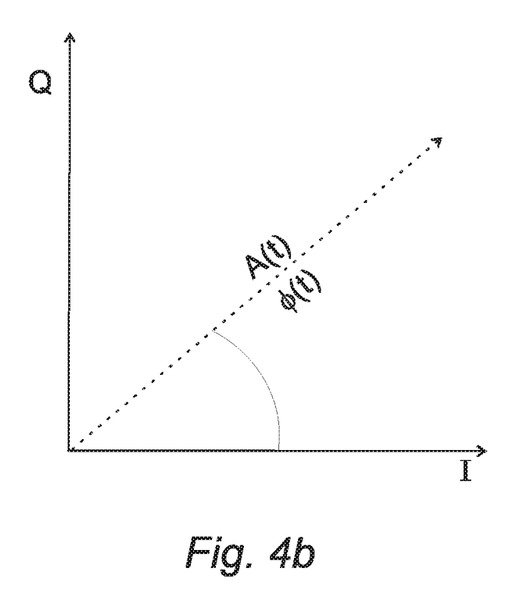

Referring to FIG. 4a, the in-phase and quadrature signals can be represented as a complex number x̂(t), wherein x̂(t)=I(t)+jQ(t). Referring to FIG. 4b, and using Euler's law, the amplitude and phase terms (A(t) and φ(t)) of the received signal ŝ(t) can be determined from the following expressions:

$$A(t) = \sqrt{I(t)^2 + Q(t)^2} \quad (4)$$

$$\phi(t) = \tan^{-1}\left(\frac{Q(t)}{I(t)}\right) \quad (5)$$

The discussions so far, have related to an ideal situation in which the sine and cosine signals, employed in the quadrature demodulator, are perfectly balanced. However, in practice, the sine and cosine signals are typically provided by an RF oscillator whose outputs are rarely in perfect quadrature (i.e. usually have different amplitudes and are not exactly 90° out of phase). Thus, such balance is unlikely. The mixers 16, 18 may introduce further imbalance (since the gain and phase response through the I and Q paths is not exactly the same).

Figure 5:
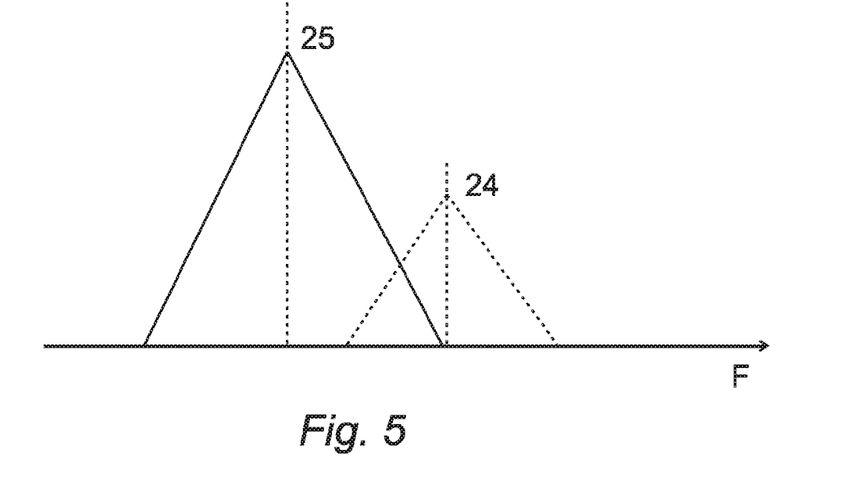
FIG. 5 is a spectrum of a desired demodulated baseband signal with an overlapping image spectrum of an unwanted frequency channel.
Figure 6:
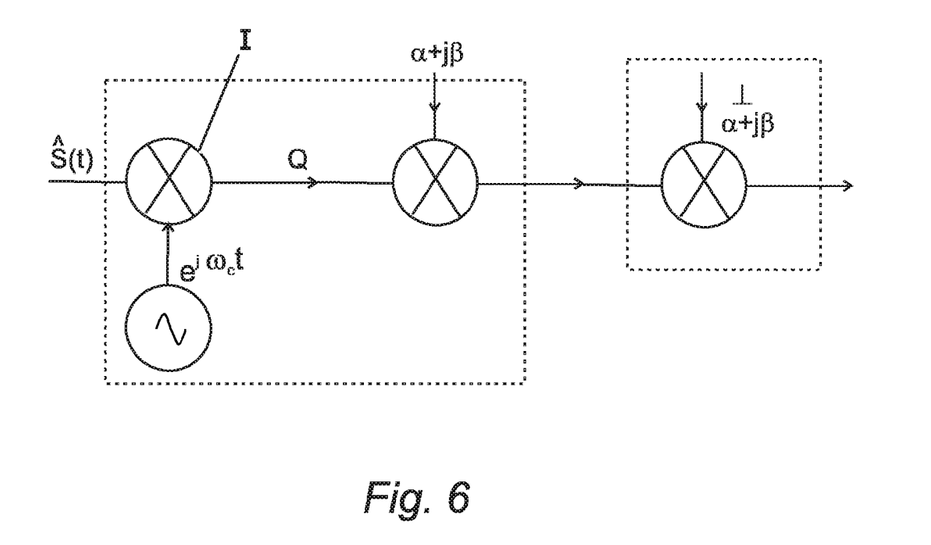
FIG. 6 is a complex domain representation of the operation of a conventional balancing circuit in the receiver of FIG. 1.

As a result, the translation of a received signal ŝ(t) to the baseband may include a translation in the other direction. In this case, whilst components from the desired frequency translation will dominate the resulting spectrum, components produced by the frequency translation in the opposite direction will also exist. Furthermore, as shown in FIG. 5, an image of a strong unwanted frequency channel 24 may fall within the frequency band of a desired signal 25. Referring to FIG. 6, and representing an imbalance in a receiver's I and Q channels by a complex variable α+jβ the introduction of a balancing circuit (1/(α+jβ)) (comprising mixing circuits) into the receiver can overcome the imbalance.

B. Calibration of a Receiver's Balancing Circuit

The basic premise underlying the present embodiments is the re-use of equipment already included within a receiver to generate a test tone for calibrating the receiver's balancing circuits. In particular, the present embodiments use the harmonics of a clock source already included within a receiver to:

clock a synthesiser (normally present in the receiver's demodulator) to generate a complex second calibration signal (of frequency $f_C=f_{RX}+/-f_0$, wherein $f_0$ is an offset frequency); and generate a real-valued first calibration signal (of frequency $f_{RX}$).

This approach contrasts with traditional test-tone generating systems that require an additional dedicated test tone synthesiser or an external clock source to clock the demodulator's synthesiser. Accordingly, the present embodiments substantially reduces the silicon area occupied by the receiver's demodulator. Furthermore, the present embodiments enable the receiver's balancing circuits to be calibrated over a large frequency range.

A first embodiment employs the receiver's quartz crystal as a clocking signal generator. A second embodiment uses a synthesiser (for example a digital phase locked loop (DPLL)) as a clocking signal generator. Neither embodiment is limited to a particular type of injection of the test tone. In particular, both embodiments embrace high-side and low-side injection. High side injection is where a complex second calibration signal frequency ($f_{RX}$) is programmed to be higher than the test tone ($f_C$) (i.e. $f_C=f_{RX}+f_0$). However, in low side injection $f_C=f_{RX}-f_0$. Regardless of the specific form of injection employed, the operation of the balancing circuit calibration device will result in a tone (at a difference frequency), from which a single-bin DFT can extract balancing information. In both embodiments, the calibration process is performed only once (i.e. 'off-line' at power up or during manufacture) and regular re-calibration is unnecessary.

C. General Structure of a Calibration Signal Generator for a Balancing Circuit Calibration Device A receiver's balancing circuit is calibrated using a scheme such as that described in UK Patent number GB2406984 (which is included herein by reference).

Figure 7:
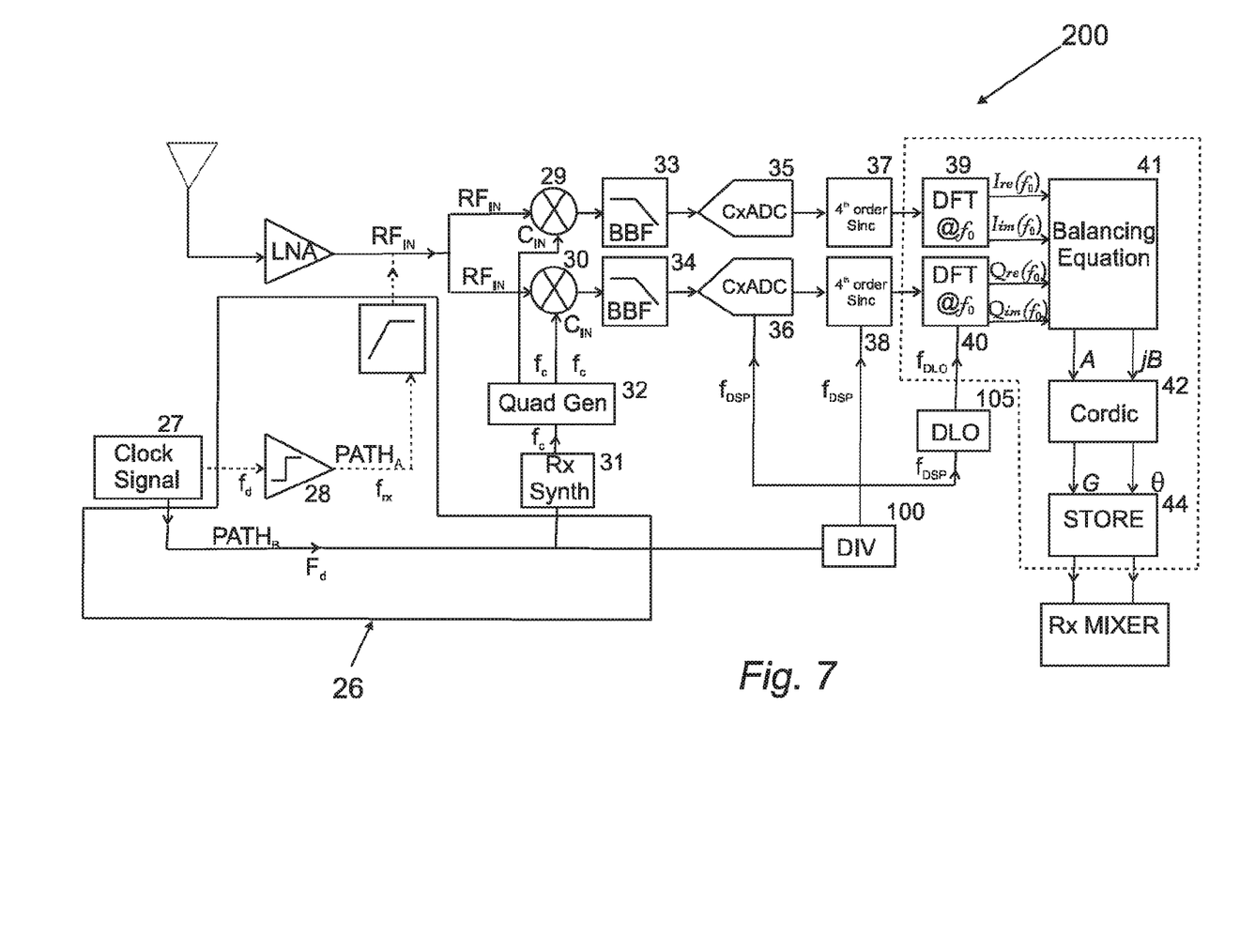
FIG. 7 is a block diagram of a calibration signal generator according to any of the embodiments in use within a balancing circuit calibration device.

Referring to FIG. 7, a calibration signal generator 26 is typically used together with a balancing circuit calibration device 200 in a receiver (not shown) to calibrate the balancing of the receiver's mixer circuits (not shown) and thereby overcome the deleterious effects of I/Q imbalance. The receiver (not shown) comprises a clocking signal generator 27 with at least two output ports. The calibration signal generator 26 comprises a connection between the first output port of the clocking signal generator 27 and a squaring amplifier 28. During calibration, the clocking signal generator 27 generates a clocking signal (of frequency $f_d$) which is transmitted through the first output port to the squaring amplifier 28. In response, the squaring amplifier 28 produces a signal (of frequency $f_{RX}$) which effectively acts as the signal ŝ(t)) received by the receiver during normal operation. For simplicity, this signal will be known henceforth as a "first calibration signal". The first calibration signal is transmitted to an RF input ($RF_{IN}$) of the receiver's mixing circuits 29, 30.

The calibration signal generator 26 also comprises a connection between the second output port of the clocking signal generator 27 and a synthesiser 31. The synthesiser 31 is connected in turn to a quadrature generator 32. Both the synthesiser 31 and the quadrature generator 32 are already present in the receiver (not shown) for the purpose of generating injected sine and cosine signals in the receiver's demodulator. The signal from the quadrature generator 32

(which for simplicity, will be known henceforth as a "second calibration signal") effectively acts as the carrier signals (sin($\omega_c t$) and cos($\omega_c t$)) injected into the demodulator during the normal operation of the receiver.

To this end, the second calibration signal is transmitted to a carrier input port ($C_{IN}$) of the mixing circuits 29, 30. During normal operation, the quadrature generator 32 is a first source of imbalance (as the sine and the cosine signals from the quadrature generator 32 will not be in perfect quadrature). The mixing circuits 29, 30 typically provide the remaining imbalance in a receiver, since each of the mixing circuits 29, 30 will have its own separate gain and phase behaviour.

The clocking signal (of frequency $f_d$) is also transmitted to the rest of the components of the balancing circuit calibration device 26, wherein it effectively acts as a master clocking signal synchronising the operation of these components. The clock rate of these components is given by $f_{DSP}$. If $f_d$ does not equal $f_{DSP}$, the clocking signal is transmitted to a frequency divider 100 or other suitable per-processing component prior to transmission to the rest of the components of the balancing circuit calibration device 26.

Since both the second calibration signal and the first calibration signal are clocked from the same clock source, namely the clocking signal generator 27, the two signals are synchronised and coherency is maintained (see later coherency discussion). For simplicity, the signal path from the clocking signal generator 27 to the RF input ($RF_{IN}$) of the mixing circuits 29, 30 will be denoted henceforth as $PATH_A$. Similarly, the signal path from the clocking signal generator 27 to the carrier input ($C_{IN}$) of the mixing circuits 29, 30, will be denoted as $PATH_B$.

On receipt of the second calibration signal and the first calibration signal, the mixing circuits 29, 30 produce a complex signal (I and Q components) whose frequency spectrum has a main-component of frequency $f_0 \ll f_{RX}$ (and possibly spurs, noise and other components). This complex signal is transmitted to baseband filters 33, 34. The output signal from the baseband filters 33, 34 is sampled and digitized by analogue to digital converters (ADCs) 35, 36 and filters 37, 38 whose operation-free frequencies are respectively given by $f_{ADC}$ and $f_{DSP}$, wherein $f_0 \ll f_{DSP} \ll f_{ADC}$. The output signals from the filters 37, 38 are then transmitted to a single bin DFT circuits 39, 40. To perform a discrete fourier transform, the single bin DFT circuits 39, 40 also receive sine and cosine signals at frequency $f_{DLO}$ from a digital local oscillator (DLO) 105 (which is clocked by the master clocking signal of frequency $f_{DSP}$). It should be noted that for the correct operation for the single bin DFT circuits 39, 40 the synchronicity of the second calibration signal and the first calibration signal is crucial.

Application of the single-bin DFT 39, 40 to the sampled digitised I and Q signals yields two complex values from which the quadrature of the balancing circuit can be determined and ultimately a balancing gain for the receiver calculated. In particular, the fundamental component of the sampled, digitised test tone is given by $$I_m(n) + jQ_m(n) = AA_i \cos(\theta(n) + \phi_i + \phi) - jAA_q \sin(\theta(n) + \phi_q + \phi) \quad (6)$$

wherein $\theta(n) = 2\pi f_0 n T_s$ is the sampled phase and $T_S$ is the sample period (and $\phi$ is an arbitrary phase common to both the I and Q paths).

Taking a single bin DFT at the discrete phase $\theta(n) = 2\pi f_0 n T_s$ over N points, where $N = N_2 - N_1 + 1$ yields $$I_m(\theta) = \sum_{n=N_1}^{N_2} I_m(n) e^{-j\theta(n)} \quad (7)$$

$$Q_m(\theta) = \sum_{n=N_1}^{N_2} Q_m(n) e^{-j\theta(n)} \quad (8)$$

$N_1$ is chosen to be sufficiently large for transient components to settle out. $N_2$ is chosen to satisfy a coherency constraint (to be discussed later).

These expressions can be re-written in polar coordinates as:

$$I_m(\theta) = \frac{AN}{2} A_i e^{j(\phi_i + \phi)} \quad (9)$$

$$Q_m(\theta) = j\frac{AN}{2} A_q e^{j(\phi_q + \phi)} \quad (10)$$

A microcontroller (not shown) uses the quadrature information from the DFT 39, 40 results to solve a balancing equation 41 and obtain a complex balancing gain to balance the receiver at a target frequency. In particular, using expressions (10) and (11) the complex balancing gain $A_b e^{j\Phi_b}$ to balance the Q channel can be determined from $$A_b e^{j\phi_b} = \frac{jI_m(\theta)}{Q_m(\theta)} = \frac{A_i}{A_q} e^{j(\phi_i - \phi_q)} \quad (11)$$

Expression (12) can be represented in Cartesian form as:

$$A_b e^{j\phi_b} = \frac{jI_m(\theta)}{Q_m(\theta)} = \frac{-I_{im} + jI_{re}}{Q_{re} + jQ_{im}} \quad (12)$$

and solved to produce $$A_b e^{j\phi_b} = \alpha + j\beta = \frac{(-I_{im} + jI_{re})(Q_{re} - jQ_{im})}{Q_{re}^2 + Q_{im}^2} \quad (13)$$

Equating the real and imaginary terms in expression (13) yields $$\begin{bmatrix} \alpha \\ \beta \end{bmatrix} = \frac{\begin{bmatrix} Q_{im} & -Q_{re} \\ Q_{re} & Q_{im} \end{bmatrix}}{Q_{re}^2 + Q_{im}^2} \begin{bmatrix} I_{re} \\ I_{im} \end{bmatrix} \quad (14)$$

Similarly, the complex balancing gain $A_b e^{j\Phi_b}$ for balancing the I channel can be determined from $$A_b e^{j\phi_b} = \frac{A_q}{A_i} e^{j(\phi_q - \phi_i)} = \frac{Q_m(\theta)}{jI_m(\theta)} \quad (15)$$

which can be solved to yield:

$$\begin{bmatrix} \alpha \\ \beta \end{bmatrix} = \frac{\begin{bmatrix} -I_{im} & I_{re} \\ -I_{re} & -I_{im} \end{bmatrix} \begin{bmatrix} Q_{re} \\ Q_{im} \end{bmatrix}}{I_{re}^2 + I_{im}^2} \quad (16)$$

The resulting complex balancing gains are converted into polar form (by a Cordic 42) and further converted into a form compatible with the receiver's balancing circuits. The result is stored 44 for later use in configuring the mixing circuits 29, 30 prior to receipt of an incoming signal.

For example, if balancing is applied to the Q channel, the mixing equation becomes $$I_0 + jQ_0 = (I_m + jQ_m A_b e^{j\phi_b}) e^{j\theta_{if}} = I_m e^{j\theta_{if}} + jQ_m e^{j(\theta_{if} + \phi_b)} \quad (17)$$

wherein $I_m + jQ_m$ is an injected complex signal and $e^{j\theta_{if}}$ a complex carrier. Expression (17) can be solved in matrix format to yield $$\begin{bmatrix} I_0 \\ Q_0 \end{bmatrix} = \begin{bmatrix} \cos\theta_{if} & -A_b \sin(\theta_{if} + \phi_b) \\ \sin\theta_{if} & A_b \cos(\theta_{if} + \phi_b) \end{bmatrix} \begin{bmatrix} I_m \\ Q_m \end{bmatrix} \quad (18)$$

As an aside, in an alternative configuration, the sequencing of the balancing equation 41 solution is rearranged so that it is performed in polar form. In this case, the Cordic 42 is used twice, to convert the DFT 39, 40 results into polar format. The balancing equation 41 is formulated and solved in polar format and the result directly stored 44 for later use.

The first and second embodiments are concerned with the clocking signal generator 27 and its relationship with the squaring amplifier 28 and synthesiser 31.

D. Clocking Signal Generator in a Balancing Circuit Calibration Apparatus

Embodiment 1

Crystal Clocking Signal Generator

Figure 8:
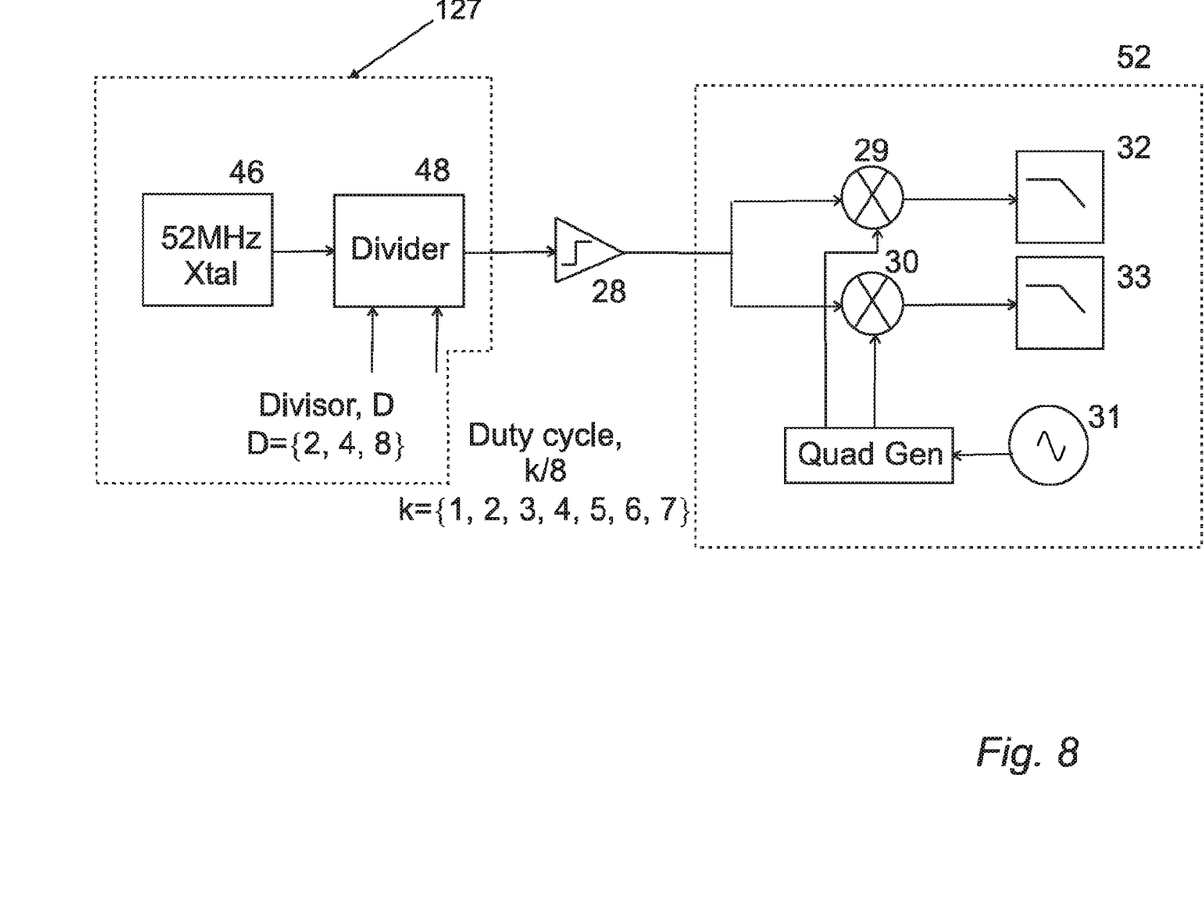
FIG. 8 is a block diagram of a $PATH_A$ in the first embodiment of the calibration signal generator shown in FIG. 7.

Referring to FIG. 8, the first embodiment of the clocking signal generator 127 comprises the receiver's quartz crystal 46 connected to a divider circuit 48. In the present example, the crystal provides a 52 MHz clocking signal. However, it will be appreciated that the first embodiment 127 is not limited to a crystal of this frequency. In particular, crystals of other frequencies could also be used, with corresponding divider circuits. The divider circuit 48 divides the frequency of the clocking signal from the crystal 46 according to a pre-defined integer factor ( ) so that the frequency of the output signal from the divider circuit 48 is 1/times the frequency ($f_d$) of the clocking signal from the crystal 46.

D.1(a) PATH$_A$ from Crystal

The squaring amplifier 50 converts the output signal from the divider circuit 48 into a series of pulses. The squaring amplifier 50 has a predefined duty cycle ( ), being the ratio of the duration that the pulses are non-zero to the overall period of the pulses. The value of the duty cycle determines the power in a given harmonic of the output signal from the divider circuit 48, wherein the square wave output signal from the squaring amplifier 50 is the first calibration signal.

D.1(a)(i) Frequency Divider Circuit (48)

There are four frequency bands designated for the operation of mobile phones, namely:

Global System for Mobile Communications (GSM) 850 band (downlink 869-894 MHz)

GSM 900 band (downlink 935-960 MHz)

Digital Cellular System (DCS) 1800 band (downlink 1805-1880 MHz); and

Personal Communication Service (PCS) 1900 band (downlink 1930-1990 MHz).

For the sake of example, the present embodiment will be described, with reference to the above GSM frequency bands. However, it will be understood that the present embodiments are not limited to a GSM implementation, but could instead be implemented with any suitable receiver protocol (e.g. 3G) and associated frequency band. To develop a generalised calibration scheme for a GSM receiver, it is necessary to detect receiver I/Q imbalance in all of the above-mentioned GSM frequency bands. Further, for robust calibration in each such frequency band, it is necessary to generate a plurality of test tones within each frequency band.

Figure 9:
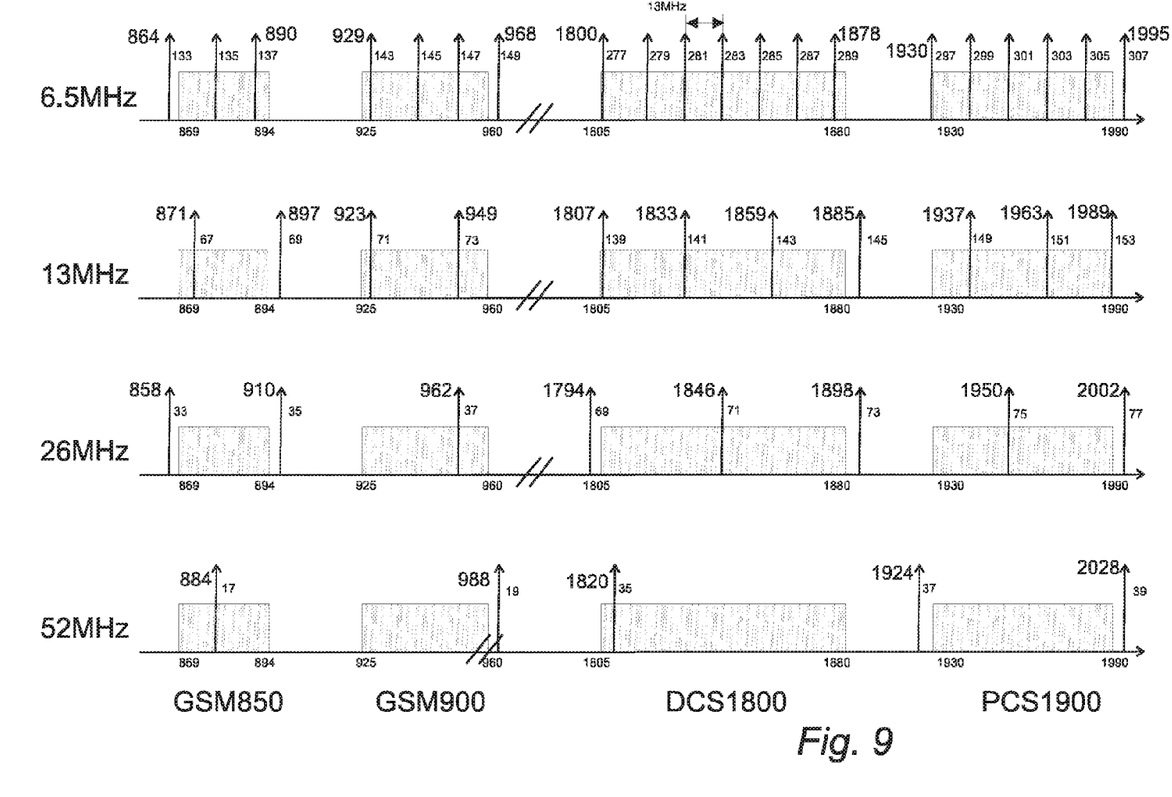
FIG. 9 is a block diagram showing the 6.5, 13, 26 and 52 MHz odd harmonic frequency plan with a 50% duty cycle of a crystal employed in the first embodiment.

Referring to FIG. 9, the $17^{th}$ harmonic of the clocking signal from the 52 MHz crystal has a frequency of 884 MHz (i.e. 17×52 MHz). This signal is roughly in the middle of the GSM 850 band. However, the 52 MHz clocking signal has no other harmonics in the other GSM frequency bands. In other words, the raw signal from the 52 MHz crystal provides very limited coverage of the four GSM frequency bands. Thus, the raw signal from the 52 MHz crystal is not suitable for developing a generalised calibration scheme for a GSM receiver.

Dividing the frequency of the 52 MHz clocking signal by two, results in a 26 MHz clocking signal. The $37^{th}$ harmonic of the resulting 26 MHz clocking signal has a frequency of 962 MHz, which is within the GSM 900 frequency band. Similarly, the $71^{st}$ harmonic of the 26 MHz clocking signal has a frequency of 1846 MHz, which is within the DCS 1800 frequency band. Thus, greater coverage of the four GSM frequency bands is achieved by dividing the 52 MHz clocking signal (from the crystal) by two. Continuing from this, it can be seen that the best coverage of the four GSM frequency bands is achieved by dividing the frequency of the 52 MHz clocking signal by eight (to produce a 6.5 MHz clocking signal).

D.1(a)(ii) Squaring Amplifier

Merely using a divider circuit 48 to divide the frequency of the clocking signal from the crystal 46 and thereby obtain harmonics in the four GSM frequency bands is not sufficient to generate a first calibration signal suitable for calibrating a receiver's balancing circuits. In particular, even if the frequency of a given harmonic resides within a desired GMS frequency band, the harmonic is of little use for calibration if it does not contain enough power to be detectable above ambient noise levels.

Figure 10:
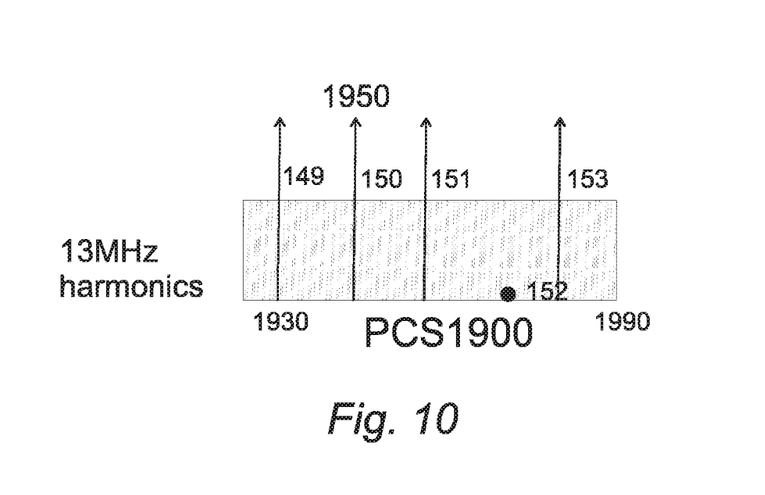
FIG. 10 is a block diagram showing the presence in the $149^{th}$, $150_{th}$ $151^{st}$, $152^{nd}$ and $153^{rd}$ harmonics of a 13 MHz clocking signal in the PCS 1900 band.

For example, and referring to FIG. 10, the $150^{th}$ harmonic of a 13 MHz clock signal (obtained by dividing the 52 MHZ clocking signal from the crystal by four) has a frequency of 1950 MHz, which is within the PCS 1900 frequency band. This clocking signal achieves its maximum power with a duty cycle (of the squaring amplifier) of ⅔ and ⅝. However, the $152^{nd}$ harmonic of the 13 MHz clocking signal (i.e. with a frequency of 1976 MHz, which is within the PCS 1900 frequency band) does not have enough power to be useful for calibration, with a duty cycle resolution of ⅛.

For a clocking signal of peak-to-peak amplitude A, and a squaring amplifier duty cycle δ, the amplitude ($X_n$) of the nth harmonic of the clocking signal is given by:

$$x_n = 2A\delta \frac{\sin(n\pi\delta)}{n\pi\delta} \quad (19)$$

Thus, the power $P_n$ in the nth harmonic is given by $$P_n = \frac{|X_n|^2}{2} \quad (20)$$

From these expressions it can be seen that the power in a given harmonic is dependent on the squaring amplifier's duty cycle. In particular, it can be seen that higher order harmonics have reduced power compared with lower order harmonics; and are particularly sensitive to changes in the duty cycle. Beyond the problem of detecting a low power first calibration signal above ambient noise, the use of such a first calibration signal would entail a long calculation time for the performance of the single bin—DFT (of FIG. 7). For example, if a $307^{th}$ harmonic was used as a first calibration signal, the calibration process would take approximately 3 ms. However, the calculation time decreases inversely with the power in a first calibration signal.

Figure 11:
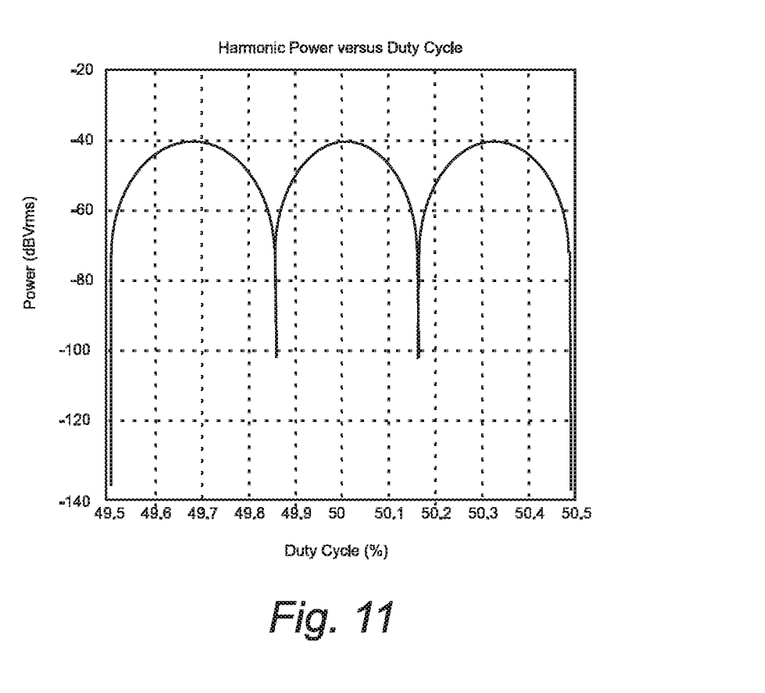
FIG. 11 is a graph of the power in the $307^{th}$ harmonic of a 6.5 MHz clocking signal as a function of a duty cycle of a squaring amplifier.

For example, the highest harmonic of a clocking signal of 6.5 MHz, is the $307^{th}$ harmonic. If this clocking signal has a peak-to-peak amplitude A=200 mV and is used in a balancing circuit whose mixing circuits have a gain of 13 dB and whose base band filters have a gain of 18 dB, the baseband power of the first calibration signal as a function of the duty cycle ($\delta$) of the squaring amplifier is shown in FIG. 11. In this case, it can be seen that maximum power is achieved with a 50% duty cycle. The power in the harmonic is very sensitive to changes in the duty cycle. Thus, very narrow tolerances are allowed on the setting of the duty cycle to enable a test-tone with sufficient power to be generated.

An odd-valued nth harmonic of the clocking signal achieves its maximum power at:

$$n\pi\delta = (2m+1)\frac{\pi}{2} \Rightarrow \delta = \frac{2m+1}{2n}, m \in z^+ \quad (21)$$

For example, the third harmonic (n=3) of a clocking signal achieves its maximum power for a duty cycle ($\delta$) of ⅙, 3/6 and ⅚. Similarly, the fourth harmonic (n=4) of the clocking signal achieves its maximum power for a duty cycle ($\delta$) of ⅛, ⅜, ⅝ and ⅞.

Thus, if a duty cycle can be divided into steps of ⅛, maximal power can be achieved in the odd harmonics of a clocking signal of 6.5 MHz (obtained by dividing the clocking signal from the 52 MHz crystal by eight), with a duty cycle ($\delta$) of $$\delta = \frac{2m+1}{2n} = \frac{k}{8}, \quad (22)$$
$$k \in \{1, 2, 3, 4, 5, 6, 7\}$$

FIGS. 9-11 indicate duty cycles and harmonics to obtain useful first calibration signals using 6.5 MHz, 13 MHz, 26 MHz and 52 MHz clocking signals.

Figure 12:
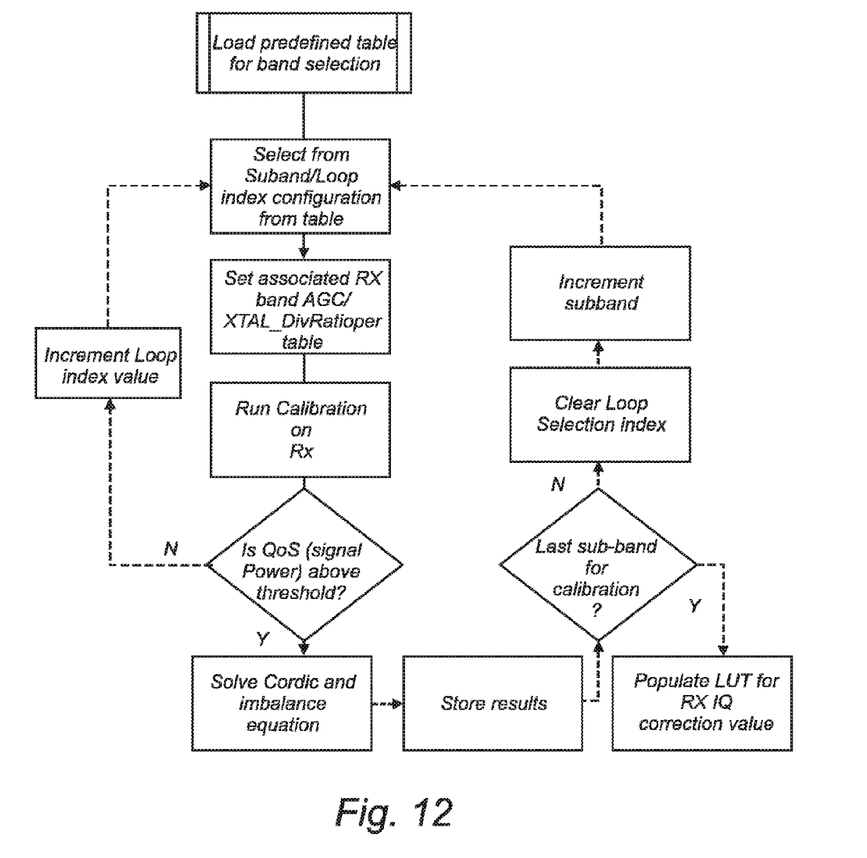
FIG. 12 is a flowchart of the operation of algorithm for switching to another harmonic in the event that a duty cycle cannot be guaranteed for a given harmonic.

Referring to FIG. 12, in cases where a duty cycle cannot be guaranteed an additional algorithm is provided for switching to another harmonic. The algorithm comprises the following steps:

(1) assuming a near 50% duty cycle (so that odd harmonics have maximum power and even harmonics have minimum power);

(2) measuring the approximate power in a current harmonic (following an attempt to calibrate the receiver's balancing circuits), by summing the absolute value of the four individual DFT sums (which arise because each DFT sum is complex with a real and imaginary term);

(3) using the neighbouring even harmonic or the nearest odd harmonic with a doubling in divisor of the clocking signal, in the event that the approximate power is less than a predefined threshold (e.g. If the $307^{th}$ odd harmonic of the 52 Mhz/8 clocking signal is less than the lower threshold, use the neighbouring even harmonics (i.e. 306 or 308) or the nearest odd harmonic (153 or 155) of the 52 Mhz/4 clocking signal, since in this case, the duty cycle has shifted from 50% and the power in the odd harmonics is decreasing, while the power in the even harmonics is increasing, similarly, the nearest odd harmonic with a doubling or divisor is achieving maximal power; and (4) re-running the calibration process, with the receiver's synthesiser reprogrammed offset from the even harmonic by $f_o$.

More particularly, loop index selects different configurations of clock divider and PLL frequencies in a sub-band if the previous IQ calibration tone was not of sufficient magnitude to perform calibration. It will be noted that, synthesiser control word signifies a different frequency of the RF local oscillator.

D.1 (b) PATH$_B$ from Crystal

Referring to FIGS. 7 and 8, the clocking signal ($f_d$) from the crystal 46 is mixed with a signal ($f_C$) from the synthesiser 31 to generate a second calibration signal. The synthesiser 31 is programmed to be a specific offset ($f_o$) from the relevant crystal harmonic, and the second calibration signal resulting from the mixing of the signals from the crystal 46 and the synthesiser 31 has a fundamental equal to the offset.

Embodiment 2

Synthesiser Clocking Signal Generator

The second embodiment uses a synthesiser, for example a digital phase locked loop (DPLL) (which is normally present in a receiver to synchronise it with a base station)) to generate a clocking signal. The synthesiser is programmed so that a harmonic of its clock signal falls at the target frequency at which the receiver is to be balanced. The synthesiser is not connected to a frequency divider 48, but otherwise, the synthesiser has the same connection paths (PATH$_A$ and PATH$_B$) as the crystal of the first embodiment.

E. Coherency Requirements

Referring to FIG. 7, the calibration of a receiver's balancing circuits (from a single bin DFT 39, 40 or discrete time Fourier transform (DTFT)) requires three sufficient-conditions to be satisfied.

Condition 1: Coherent Offset i.e. Condition on the Difference Between $f_c$ and $f_{RX}$)

The clocking signal generator 27 and the synthesiser 31 must be programmed so that the offset frequency ($f_o$)) occurs at an integer division of the baseband rate (i.e. the difference stated in equation 23 is exactly equal to the offset frequency ($f_o$)) stated in equation 25). More particularly, the mixing circuits 29, 30 must produce a complex, possibly unbalanced tone of frequency ($f_c$), given exactly by $$f_0 = f_c - f_d * \text{harmonic} \qquad (23)$$

The offset of the synthesiser 31 is selected so that the offset frequency ($f_0$) of the second calibration signal occurs at an integer division of the baseband data rate (i.e. so that the second calibration signal is coherent with the baseband sampling rate). This ensures that the absolute frequency setting of the relevant harmonic from the clocking signal generator 27 and the synthesiser 31 is no longer crucial.

Condition 2: Coherent DLO (on Offset Frequency $f_0$)

To optimise the accuracy and convergence of the single bin DFT 39, 40 (or DTFT), the DLO (105) must be capable of generating a tone at exactly the bin frequency of the DFT 39, 40 (or DTFT). In general, a DLO 105 can produce a digital tone having a frequency of $$f_{DLO} = D \frac{f_{DSP}}{M_{DLO}} \qquad (24)$$

where $f_{DLO}$ is a DLO clock, $M_{DLO}$ is the modulus of a DLO phase accumulator and $D \in z^+$.

However, to be coherent with the offset frequency ($f_0$), the DLO 105 must satisfy the following equality $$\frac{M_{DLO}}{D} = \frac{f_{DSP}}{f_o} \qquad (25)$$

so that, the $D^{th}$ bin of the DLO 105 falls exactly on $f_0$ wherein the ratio $$\left(\frac{M_{DLO}}{D}\right)$$

is an integer (i.e., does not have a fractional-part).

Condition 3: Coherent DFT (on the Size (N2−N1+1) of the Single-Bin DTFT Computation)

To maximise the accuracy and minimise the convergence time of the DFT algorithm, the fundamental frequency of the sampled, digitised output from the ADCs 35, 36 must fall exactly on the bin of the single-bin DFT 39, 40.

This condition prevents spectral leakage and can be achieved by ensuring that an exact integer number of periods (M) of the fundamental are sampled and used in the DFT summation. This is equivalent to a restriction on ($N_2 - N_1 + 1$). The bin frequency ($f_{bin}$) can be determined from the following expression $$f_{bin} = M \frac{f_s}{N} = f_o \qquad (26)$$

wherein N is the number of sample points applied to the DFT 39, 40 and $M \in z^+$ is the integer number of periods of the fundamental used in the DFT 39, 40.

Referring to the single bin DFT expressions (7) and (8), $N_2$ must satisfy the coherency constraint $$N_2 = N_1 + M \frac{f_s}{f_o} - 1 \qquad (27)$$

As mentioned earlier, $N_1$ is chosen to be sufficiently large for system transients to settle out. Similarly, M is chosen to trade between accuracy and fixed-point implementation limitations. The larger the value of M, the longer the average effect of the correlation or coherent detection of the DFT 39, 40 (and the finer the accuracy). However, as M grows, larger word sizes are required to implement the DFT 39, 40 and balancing equation 41.

F. Implementation Examples

The first implementation relates to a balancing circuit calibration device in which the output from its clocking signal generator is of fixed frequency ($f_d$). The second implementation relates to balancing circuit calibration device in which the output from its clocking signal generator is of variable frequency, thereby resulting in variations in the master clocking signal ($f_{DSP}$) and the operating frequency of the receiver's $ADC_s$. The second implementation demonstrates that the present embodiments are not limited to a fixed frequency ($f_d$) from the clocking signal generator. In particular, the present embodiments also work for the general case of a variable $f_d$, provided that the above described coherency requirements are satisfied. Both implementations are described with reference to FIG. 7.

F.1 Fixed $f_d$ Implementation

Condition 1: Coherent Offset

The underlying data rate of the balancing circuit calibration apparatus is demonstrated in the output rate of the filters 37, 38 (which in the present implementation is 52 MHz/24). To ensure that the digital baseband fundamental falls exactly on the bin of the DFT 39, 40, the frequency of the fundamental must be chosen to be an integer division of the master clocking signal rate, as given in expression 28 below.

$$f_0 = \frac{f_{DSP}}{k} = \frac{52 \text{ MHz}}{24k} \quad k \in z^+ \qquad (28)$$

For example, for an offset frequency close to 100 kHz, taking k=21 gives $f_0$=103.1746 kHz.

Condition 2: Coherent DLO

For a 52 MHz master clocking signal, the second coherency condition is satisfied with the following expression $$D \frac{F_{DLO}}{M_{DLO}} = f_0 = \frac{52 \text{ MHz}}{k.24} \qquad (29)$$

In practice, the only way this can be satisfied for the general case, is by constraining the phase accumulator modulus. For example, taking $f_{DLO}$=52 MHz/4, the modulus must satisfy $M_{DLO}$=6 kD, k,D$\in z^+$.

F.2 Variable $f_d$ Implementation

If the same clocking signal (of frequency $f_d$) is used to generate the first calibration signal, and provide the master clocking signal ($f_{DSP}$), $f_{DSP}$ and $f_{ADC}$ will change with changes in $f_d$ (as the receiver is tuned to different channels). However, under coherency condition 2, the DLO 105 must generate a tone at exactly the bin frequency of the single-bin DFT 39, 40. To maintain high performance, the DLO 105 must meet very stringent demands on its phase-noise and frequency-accuracy. In particular, the frequency of the tone generated by the DLO 105 must not vary regardless of any changes in $f_{DSP}$.

Ideally, a receiver's ADCs 35, 36 must be capable of delivering a high-quality signal as their sampling frequency ($f_s$) changes. However, normally both $f_s$ and $f_{ADC}$ change when $f_d$ is changed. Since $$f_s = \frac{f_d * \text{harmonic}}{D}$$

the absolute variation of $f_S$ with changes in $f_d$, is small relative to absolute variation of ($f_d$*harmonic) [which is determined by the specification 3GPP 45.005].

Condition 1: Coherent Offset

This condition may not be exactly satisfied because of the finite resolution of the clocking signal generator 27 and synthesiser 31 in FIG. 7.

Condition 2: Coherent DLO

DLO output is given by:

$$\cos(2\pi n(f_o f_{DSP})) + j \sin(2\pi n(f_o f_{DSP})) \qquad (30)$$

where n is the index of a discrete sample acquired by the ADCs 35, 36 and $f_0 = f_{mix} - f_d$*harmonic. DLO resolution at $f_{DSP}$ is about 2 KHz for current transceivers. However, if the error $|f_{DLO} - f_0|$ exceeds 10 Hz the balancing circuit calibration device cannot estimate I/Q imbalance accurately. To overcome this problem, impose the condition $f_0 = f_{DLO} = f_{DSP}/I$ (I=16, 32, 24, . . . or any integer of form $2^{i_0} \times 3^{i_1} \times 5^{i_2}$ where $0 \leq i_0 < 5$, $0 \leq i_1 < 2$, $0 \leq i_2 < 2$). In this case, the DLO output given in expression (26) simplifies to $\exp(j(2\pi/I)n)$ and is perfect, being limited only by its numerical precision. Furthermore, the phase-noise, frequency-accuracy performance of the DLO is good.

The DLO output can be computed using CORDIC implemented by firmware on microcontroller. Alternatively, the DLO output can be calculated by means of a look-up table, generated in accordance with the Chinese remainder theorem. In particular, from expression (30) above, it can be seen that the DLO output sequence is periodic with period I samples at $f_{DSP}$. If I=16, the DLO only needs to produce sixteen distinct values. Furthermore, the symmetry of a sinusoid means that eight of the values are exact negatives of the other eight (the set of 16 numbers comprises {a1, a2, . . . , a8, −a1, −a2, . . . −a8}). Thus, the table storage requirements for the DLO can be simplified by factor of 8 without requiring traditional-DLO interpolation.

Condition 3: Coherent DFT

This condition is satisfied since samples of size C can be exactly captured from the ADC and a single bin DTFT calculated thereon with $$\left(\frac{f_s}{C}\right)Z = f_0 = \frac{f_s}{M}$$

for some integers C, Z. This is equivalent to C=M*Z.

However, in the present implementation, the problem of coherent sampling is easily solved since capturing multiples of sixteen samples at $f_S = f_{ADC}$ ensures that we have captured integral multiples of the fundamental-period of waveform at the output of the RF-analog-mixer for baseband processing. In other words, $f_o$ occurs in the $Z^{th}$ bin (Z=bin with offset tone) of a DTFT (of coherent FFT size point $P_{coh}$) of a signal sampled at $f_{DSP}$, wherein Z refers to a bin with an offset tone and is given by $P_{coh}/16$.

Modifications and alterations may be made to the above without departing from the scope of the invention.

The invention claimed is:

1. A calibration signal generator for use in a balancing circuit calibration device in a radio receiver, the calibration signal generator comprising:
   an amplifier for amplifying a clocking signal from a clocking signal generator to provide a first calibration signal, wherein the amplifier is a squaring amplifier, whose duty cycle is adjustable to control the power in a selected harmonic of the clocking signal;
   a quadrature generator for generating a second calibration signal from the clocking signal, the first and second calibration signals being transmissible to a one or more mixing circuits in the balancing circuit calibration device; and
   a synchronizer for synchronising the operation of the balancing circuit calibration device with the clocking signal;
   wherein the clocking signal generator is present in the radio receiver.

2. The calibration signal generator as claimed in claim 1 wherein a frequency of the second calibration signal differs from the frequency of the selected harmonic of the clocking signal by an offset frequency being an integer division of a baseband frequency.

3. The calibration signal generator as claimed in claim 2 wherein the balancing circuit calibration device comprises:
   a one or more digital local oscillators configured to produce a digital local oscillator (DLO) signal on receipt of the clocking signal from the clocking signal generator;
   wherein the frequency of the DLO signal is substantially equal to the offset frequency and is substantially equal to the frequency of the clocking signal divided by a factor; and
   wherein the factor is any integer of the form $2^{i_0} \times 3^{i_1} \times 5^{i_2}$ where $0 \leq i_0 < 5$, $0 \leq i_1 < 2$, $0 \leq i_2 < 2$).

4. The calibration signal generator as claimed in claim 2, wherein the balancing circuit calibration device comprises a one or more discrete Fourier transforming components, configured so that the frequency of a digital local oscillator (DLO) signal is substantially equal to a bin frequency of the discrete Fourier transforming components.

5. The calibration signal generator as claimed in claim 4, wherein the balancing circuit calibration device comprises a one or more analogue to digital converters configured so that a fundamental frequency of an output signal from the analogue to digital converters falls on a bin of the discrete Fourier transforming components.

6. The calibration signal generator of claim 1, wherein the clocking signal is a master clocking signal of the balancing circuit calibration device.

7. The calibration signal generator as claimed in claim 1 wherein the calibration signal generator is configured to switch to a neighbouring even harmonic or a neighboring odd harmonic in an event that a required signal to noise and power of a present harmonic can not be met.

8. The calibration signal generator as claimed in claim 7 wherein the calibration signal generator is configured to change a divisor of the clocking signal in the event that the required signal to noise and power of the present harmonic can not be met.

9. Method of using a clocking signal generator in a radio receiver, to generate a calibration signal for calibrating the receiver's balancing circuits, the method comprising:
   amplifying a clocking signal from the clocking signal generator to produce a first calibration signal;
   providing the clocking signal to a synthesiser to generate a second calibration signal therefrom;
   ensuring that the frequency of the second calibration signal differs from the frequency of the selected harmonic of the clocking signal by an offset frequency being an integer division of a baseband frequency; and
   providing the clocking signal to the balancing circuits, to synchronise their operation.

10. Method as claimed in claim 9, wherein the step of amplifying the clocking signal comprises the step of adjusting the duty cycle of a squaring amplifier to control a power in a selected harmonic of the clocking signal.

11. Method as claimed in claim 10 wherein the method comprises switching to another harmonic in the event that a required signal to noise and power of the test tone can not be met, the method comprising:
   measuring the power in a present harmonic and testing against a predefined threshold limit; and
   in the event whereby the threshold is not met switching to a neighbouring even harmonic or a neighbouring odd harmonic; and if required changing the divisor of the clocking signal.

12. Method as claimed in claim 9 wherein the method comprises:
   producing a digital local oscillator (DLO) signal from a one or more digital local oscillators on receipt of the clocking signal from the clocking signal generator;
   configuring the digital local oscillators so that the frequency of the DLO signal is substantially equal to the offset frequency and is substantially equal to the frequency of the clocking signal divided by a factor being any integer of the form $2^{i_0} \times 3^{i_1} \times 5^{i_2}$ where $0 <= i_0 < 5$, $0 <= i_1 < 2$, $0 <= i_2 < 2$).

13. Method as claimed in claim 9 wherein the method comprises:
   configuring the digital local oscillators so that the frequency of a digital local oscillator (DLO) signal is substantially equal to a bin frequency of discrete Fourier transforming components in the balancing circuits.

14. The method of claim 9 wherein the clocking signal is provided as a master clocking signal in the radio receiver.

15. The method of claim 9 wherein the providing the clocking signal to the balancing circuits, to synchronise their operation comprises:
   providing the clocking signal to a filter in the balancing circuits.

16. The method of claim 15 wherein the providing the clocking signal to the filter in the balancing circuits comprises:
   providing the clocking signal via a frequency divider to the filter in the balancing circuits.

17. The method of claim 9 wherein the providing the clocking signal to the balancing circuits, to synchronise their operation comprises:
   providing the clocking signal to a digital local oscillator in the balancing circuits.

18. The method of claim 17 wherein the providing the clocking signal to the digital local oscillator in the balancing circuits comprises:
   providing the clocking signal via a frequency divider to the digital local oscillator in the balancing circuits.

19. A calibration signal generator for use in a balancing circuit calibration device in a radio receiver, the calibration signal generator comprising:
   an amplifier for amplifying a clocking signal from a clocking signal generator, wherein a selected harmonic of the clocking signal provides a first calibration signal;
   a quadrature generator for generating a second calibration signal from the clocking signal, the first and second calibration signals being transmissible to a one or more mixing circuits in the balancing circuit calibration device; and
   a synchronizer for synchronising the operation of the balancing circuit calibration device with the clocking signal; wherein the clocking signal generator is present in the radio receiver;
   wherein the calibration signal generator is configured to switch to a neighboring even harmonic or a neighboring odd harmonic as a newly selected harmonic in an event that a required signal to noise and power of the selected harmonic can not be met.

* * * * *